(12) United States Patent
Morand et al.

(10) Patent No.: US 11,038,498 B2
(45) Date of Patent: Jun. 15, 2021

(54) DEVICE AND METHOD FOR CONTROLLING SWITCHING

(71) Applicant: MITSUBISHI ELECTRIC CORPORATION, Tokyo (JP)

(72) Inventors: Julien Morand, Rennes (FR); Julio Cezar Brandelero, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/975,947

(22) PCT Filed: Mar. 6, 2019

(86) PCT No.: PCT/JP2019/010125
§ 371 (c)(1),
(2) Date: Aug. 26, 2020

(87) PCT Pub. No.: WO2019/188267
PCT Pub. Date: Oct. 3, 2019

(65) Prior Publication Data
US 2020/0412354 A1    Dec. 31, 2020

(30) Foreign Application Priority Data

Mar. 26, 2018  (EP) ..................... 18163864

(51) Int. Cl.
*H03K 17/042*   (2006.01)
*H02M 1/08*    (2006.01)
(Continued)

(52) U.S. Cl.
CPC ........ *H03K 17/04206* (2013.01); *H02M 1/08* (2013.01); *H03K 17/165* (2013.01);
(Continued)

(58) Field of Classification Search
CPC .... H03K 17/16; H03K 17/161; H03K 17/165; H03K 17/168; H03K 17/042;
(Continued)

(56) References Cited

U.S. PATENT DOCUMENTS

| 2012/0032709 A1* | 2/2012 | Saotome | ............ H03K 17/0424 327/109 |
| 2013/0181750 A1* | 7/2013 | Lobsiger | ................ H03K 17/06 327/109 |

(Continued)

FOREIGN PATENT DOCUMENTS

| EP | 2 418 776 A1 | 2/2012 |
| EP | 2 615 737 A1 | 7/2013 |

*Primary Examiner* — Tomi Skibinski
(74) *Attorney, Agent, or Firm* — Birch, Stewart, Kolasch & Birch, LLP

(57) ABSTRACT

The present invention concerns a device and a method for controlling the switching from a conducting state to a non conducting state or from a non conducting state to a conducting state of a semiconductor power switch providing current to a load, the device receiving an input signal that is intended to drive the semiconductor power switch. The invention: —senses the derivative of the drain to source current going through the semiconductor power switch in order to obtain a voltage representative of the sensed derivative of drain to source current, —amplifies the voltage representative of the sensed derivative of drain to source current, —adds the amplified voltage representative of the derivative of the sensed drain to source current to the input signal during a given time period.

10 Claims, 9 Drawing Sheets

(51) Int. Cl.
*H03K 17/16* (2006.01)
*H02M 1/00* (2006.01)

(52) U.S. Cl.
CPC ............... *H02M 2001/0009* (2013.01); *H02M 2001/0054* (2013.01)

(58) Field of Classification Search
CPC ...... H03K 17/04206; H03K 17/04213; H02M 1/08; H02M 2001/0009; H02M 2001/0054
USPC .................. 327/108–112; 326/82, 83, 87
See application file for complete search history.

(56) References Cited

U.S. PATENT DOCUMENTS

2016/0336936 A1\* 11/2016 Ma ..................... H03K 17/0406
2019/0386557 A1\* 12/2019 Wang .................. H02M 7/5387

\* cited by examiner

DEVICE AND METHOD FOR CONTROLLING SWITCHING

TECHNICAL FIELD

The present invention relates generally to a device and a method for controlling the switching of at least a first power semiconductor switch providing current to a load.

BACKGROUND ART

A classical gate driver circuit contains fixed positive and negative voltage/current power supplies called $V_{cc}$ for the positive voltage and $V_{ee}$ for the negative one, both referenced to the source of the semiconductor switch. Depending on the desired state of the semiconductor switch, the power semiconductor switch gate is connected to either supply rail by means of a switch and an optional gate resistance. For turning-on the semiconductor switch, the positive voltage/current source is connected to the gate control of the semiconductor switch, for turning-off the semiconductor switch the negative voltage/current source is connected to the gate control of the device.

Today, the switching frequency of power converters is increasing. Wide-band gap devices like GaN and SiC devices provide faster switching capabilities than classical technologies.

Wide band gap power semiconductor devices are able to switch at a high speed like for example superior to 10V/ns. This reduces the switching losses, and thus allows the use of higher switching frequencies.

High switching speed may create voltage overshoots between drain and source of power semiconductor transistor for example due to the layout stray inductance increasing the switching losses and over stressing the transistor. Overshoot may also create conducted and radiated EMI.

Some techniques applied to the gate driver circuit are used to reduce the switching speed (the voltage and current transient rate) and/or the voltage overshoot, and ringing.

The passive techniques consist in basically changing the power semiconductor switch switching behavior by inserting passive components, changing the external gate resistance and the voltage/current source values. These techniques may be used to adjust the switching speed of the semiconductor switch. However, this permanent modification on the gate driver circuit impacts the performance of the power semiconductor switch. In addition, the switching characteristics are dependent of the operating point of the power semiconductor switch.

SUMMARY OF INVENTION

The present invention aims to allow a fast switching with a low voltage overshoot and reduced ringing at the end of the switching either during turn-on and turn-off using an active controlled feedback signal that is injected in the gate driver circuit.

To that end, the present invention concerns a device for controlling the switching from a conducting state to a non conducting state or from a non conducting state to a conducting state of a semiconductor power switch providing current to a load, the device receiving an input signal that is intended to drive the semiconductor power switch, characterized in that the device comprises:
means for sensing the derivative of the drain to source current going through the semiconductor power switch in order to obtain a voltage representative of the sensed derivative of the drain to source current,
means for amplifying the voltage representative of the sensed derivative of the drain to source current,
means for adding the amplified voltage representative of the sensed derivative of the drain to source current to the input signal during a given time period.

The present invention concerns also a method for controlling the switching from a conducting state to a non conducting state or from a non conducting state to a conducting state of a semiconductor power switch providing current to a load, characterized in that the method comprises the steps of:
receiving an input signal that is intended to drive the semiconductor power switch, characterized in that the device comprises:
sensing the derivative of the drain to source current going through the semiconductor power switch in order to obtain a voltage representative of the sensed derivative of the drain to source current,
amplifying the voltage representative of the derivative of the sensed drain to source current,
adding the amplified voltage representative of the derivative of the sensed drain to source current to the input signal during a given time period.

Thus, the present invention reduces the current transient rate and/or the voltage overshoot.

According to a particular feature, the means for sensing the derivative of the drain to source current going through the semiconductor power switch are composed of a Rogowski coil.

Thus, no additional circuitry is required comparing to a current sensor that will need a derivative block. In addition, the Rogowski coil is able to measure the derivative contactless and is not dependent on the switch parasitic inductance.

According to a particular feature, the given time period is the sum of the gate transition time, the voltage transition time and the current transition time plus a predetermined margin.

Thus, the current sensor is controlling the semiconductor power switch only during transition avoiding any spurious shoot through during the rest of the switching period.

According to a particular feature, the semiconductor power switch is included in a buck converter.

According to a particular feature, the semiconductor power switch is included in a boost converter.

According to a particular feature, the semiconductor power switch is included in a half bridge configuration that comprises a first and a second semiconductor power switches and the switching of each semiconductor power switch being controlled by a respective device for controlling the switching from a conducting state to a non conducting state or from a non conducting state to a conducting state.

The characteristics of the invention will emerge more clearly from a reading of the following description of example embodiments, the said description being produced with reference to the accompanying drawings.

DESCRIPTION OF EMBODIMENTS

Figure 1:
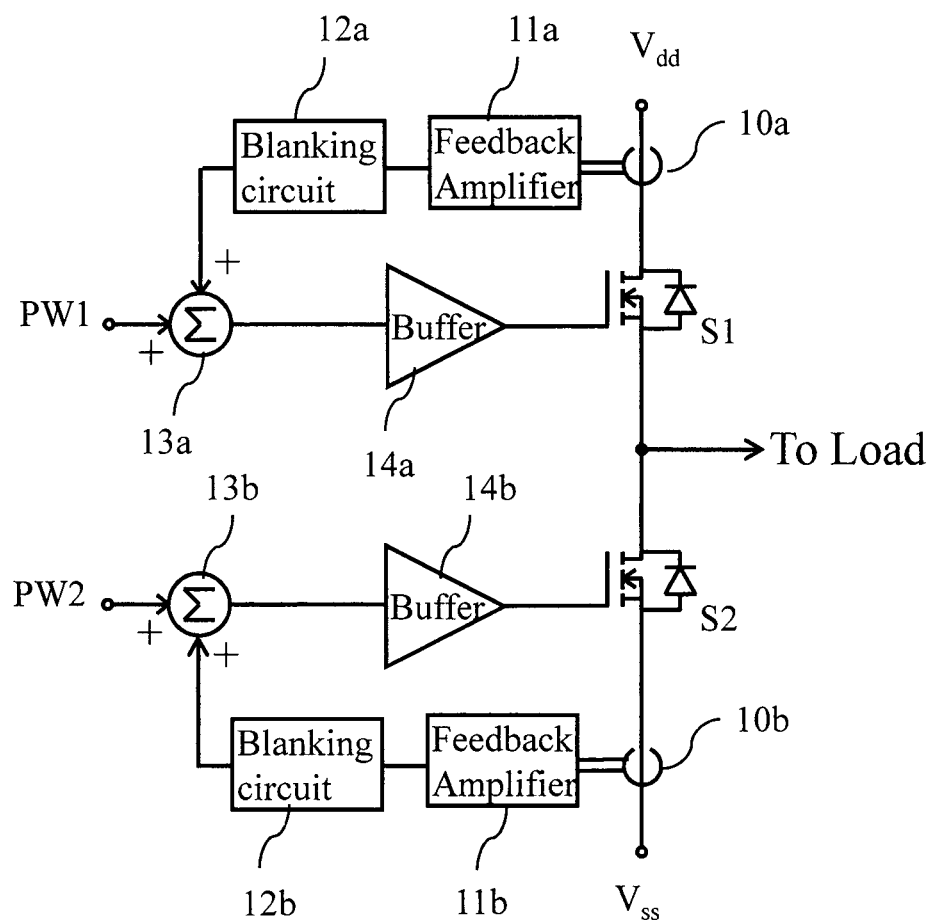
FIG. 1 represents an example of an architecture of a half bridge configuration in which the present invention may be implemented.

FIG. 1 represents an example of an architecture of a half bridge configuration in which the present invention may be implemented.

In the example of FIG. 1, a first gate trajectory control device which is composed of a current derivative sensing means 10*a*, a feedback amplifier 11*a*, a blanking circuit 12*a*, a summing circuit 13*a* and a buffer 14*a*, controls the switching of a power semiconductor switch S1 and a second gate trajectory control device which is composed of a current derivative sensing means 10*b*, a feedback amplifier 11*b*, a blanking circuit 12*b*, a summing circuit 13*b* and a buffer 14*b*, controls the switching of a power semiconductor switch S2.

The present invention is disclosed in an example based on an MOSFET application but can be extended to any unipolar (JFET, IGFET, HEMT) or bipolar transistor (BJT or IGBT), only the name of the electrodes needs to be changed.

The present invention performs the switching of a power MOSFETs in two steps. At a first step, during the voltage transition, the control of the gate-source voltages is only performed by classical input signals, i.e. a square wave signals. These signals are named PW1 and PW2. The usage of only PW1 and PW2 signals during the voltage transition helps reducing the switching losses by having a fast transition. Then, during the second step i.e. during the current transition, two different operations modes take place depending on the power semiconductor switch S1 or S2 function.

One mode operates on the conducting power semiconductor switch. The gate-source voltage of the conducting power semiconductor switch is controlled by the combination of the signal PW1 or PW2 and the amplified feedback signal provided by the feedback amplifier 11. A positive current slope in the conducting power semiconductor switch generates a negative voltage at the feedback amplifier output. The resulting signal controls the current derivative and therefore limits the overvoltage after the transition.

The other mode is intended for passive device like a MOSFET used in synchronous rectification and its antiparallel diode. In this mode, the gate to source voltage is pulled down to the negative power rail by the signal PW1 or PW2. Only the feedback signal is able to modify the gate to source voltage.

After the current transition, in both modes, the feedback signal is used to damp the resonant oscillations by partially saturating the power semiconductor switch. The power semiconductor switch acts like a variable resistor absorbing the energy stored in the parasitic elements. This energy is considered small compared to the total switching energy, while the reduced ringing improves drastically the electromagnetic perturbation.

The reference signal PW1 is provided to the summation module 13*a*. The output of the summation module 13*a* is provided to the buffer 14*a* and the output of the buffer 14*a* is provided to the gate of the power semiconductor switch S1.

The drain of the power semiconductor switch S1 is connected to a positive power supply of a bus and the current going through the connection is sensed by the current derivative sensing means 10*a*.

The outputs of the current derivative means 10*a* are provided to the feedback amplifier 11*a*. The output of the feedback amplifier 11*a* is provided to the blanking circuit 12*a*, the output of which is provided to the summation module 13*a*.

The reference signal PW2 is provided to the summation module 13*b*. The output of the summation module 13*b* is provided to the buffer 14*b* and the output of the buffer 14*b* is provided to the gate of the power semiconductor switch S2.

The drain of the power semiconductor switch S2 is connected to the source of the power semiconductor switch S1 and to a load.

The source of the power semiconductor switch S2 is connected to a negative power supply of the bus and the current going through the connection is sensed by the current derivative sensing means 10*b*.

The outputs of the current derivative means 10*b* are provided to the feedback amplifier 11*b*. The output of the feedback amplifier 11*b* is provided to the blanking circuit 12*b*, the output of which is provided to the summation module 13*b*.

Figure 2:
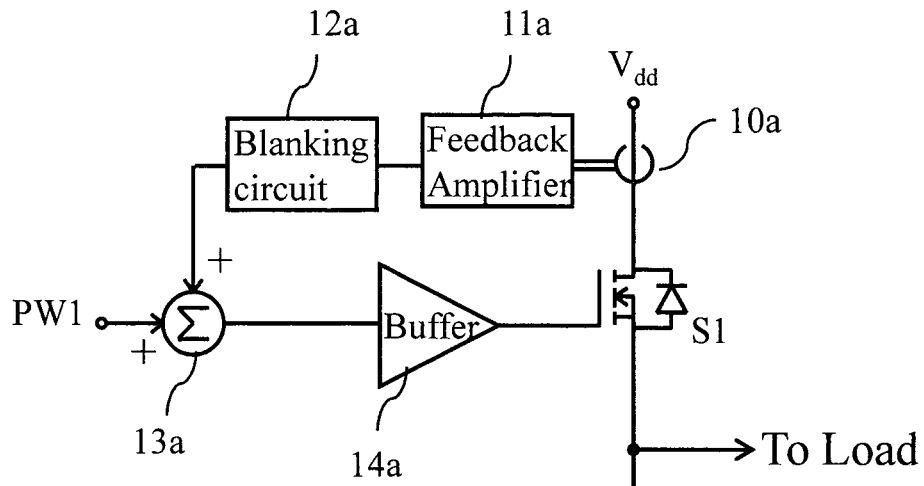
FIG. 2 represents an example of an architecture of a buck converter in which the present invention may be implemented.

FIG. 2 represents an example of an architecture of a buck converter in which the present invention may be implemented.

In the example of FIG. 2, a gate trajectory control device, which is composed of a current derivative sensing means 10*a*, a feedback amplifier 11*a*, a blanking circuit 12*a*, a summing circuit 13*a* and a buffer 14*a*, controls the switching of a power semiconductor switch S1 that is connected to a diode Da and a load.

The reference signal PW1 is provided to the summation module 13*a*. The output of the summation module 13*a* is provided to the buffer 14*a* and the output of the buffer 14*a* is provided to the gate of the power semiconductor switch S1.

The drain of the power semiconductor switch S1 is connected to a positive power supply of the bus and the current going through the connection is sensed by the current derivative sensing means 10*a*.

The source of the power semiconductor switch S1 is connected to a cathode of the diode Da, the anode of which is connected to a negative power supply.

The outputs of the current derivative means 10a are provided to the feedback amplifier 11a. The output of the feedback amplifier 11a is provided to the blanking circuit 12a, the output of which is provided to the summation module 13a.

Figure 3:
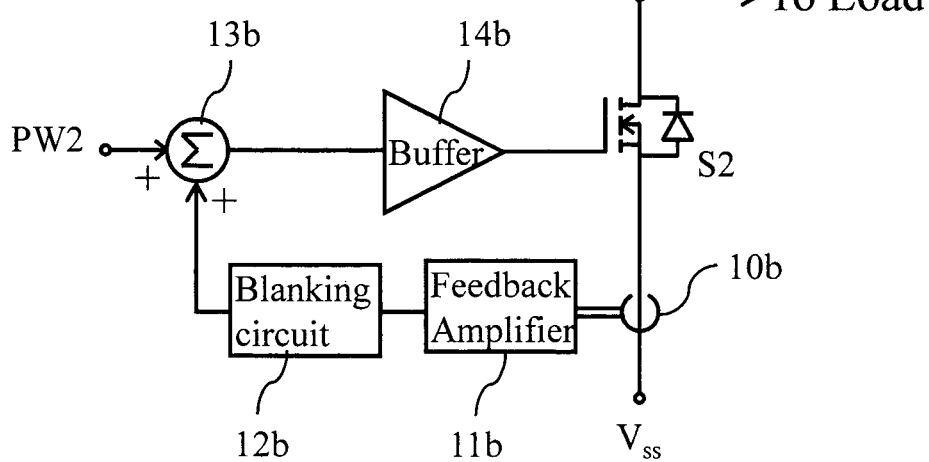
FIG. 3 represents an example of an architecture of a boost converter in which the present invention may be implemented.

FIG. 3 represents an example of an architecture of a boost converter in which the present invention may be implemented.

In the example of FIG. 3, a gate trajectory control device which is composed of a current derivative sensing means 10b, a feedback amplifier 11b, a blanking circuit 12b, a summing circuit 13b and a buffer 14b, controls the switching of a power semiconductor switch S2 that is connected to a diode Db and a load.

The reference signal PW2 is provided to the summation module 13b. The output of the summation module 13b is provided to the buffer 14b and the output of the buffer 14b is provided to the gate of the power semiconductor switch S2.

The drain of the power semiconductor switch S2 is connected to an anode of the diode and to a load the cathode of which is connected to a positive power supply.

The source of the power semiconductor switch S2 is connected to a negative power supply of the bus and the current going through the connection is sensed by the current derivative sensing means 10b.

The outputs of the current derivative means 10b are provided to the feedback amplifier 11b. The output of the feedback amplifier 11b is provided to the blanking circuit 12b, the output of which is provided to the summation module 13b.

Figure 4:
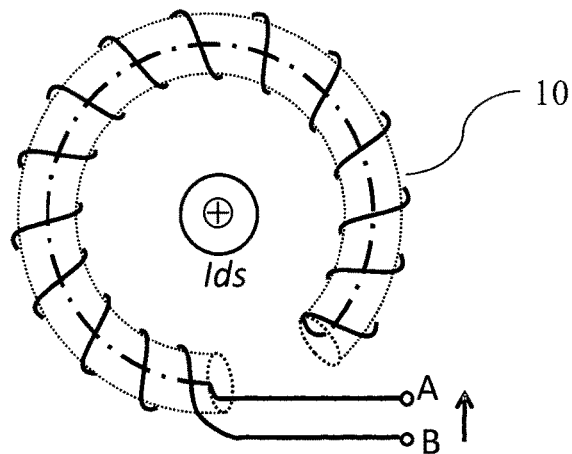
FIG. 4 represents an example of a current derivative sensor used in the present invention.

FIG. 4 represents an example of a current derivative sensor used in the present invention.

The current derivative sensor is, in the example of FIG. 4, a Rogowski coil. A Rogowski coil is an electrical device for measuring high-speed current pulses. It consists of a helical coil of wire with the lead from one end returning through the centre of the coil to the other end, so that both terminals are at the same end of the coil. The whole assembly is then wrapped around the straight conductor whose current derivative is to be measured. There is no magnetic material core. The winding density, the diameter of the coil and the rigidity of the winding are critical for preserving immunity to external fields and sensitivity to the positioning of the measured conductor.

Figure 5:
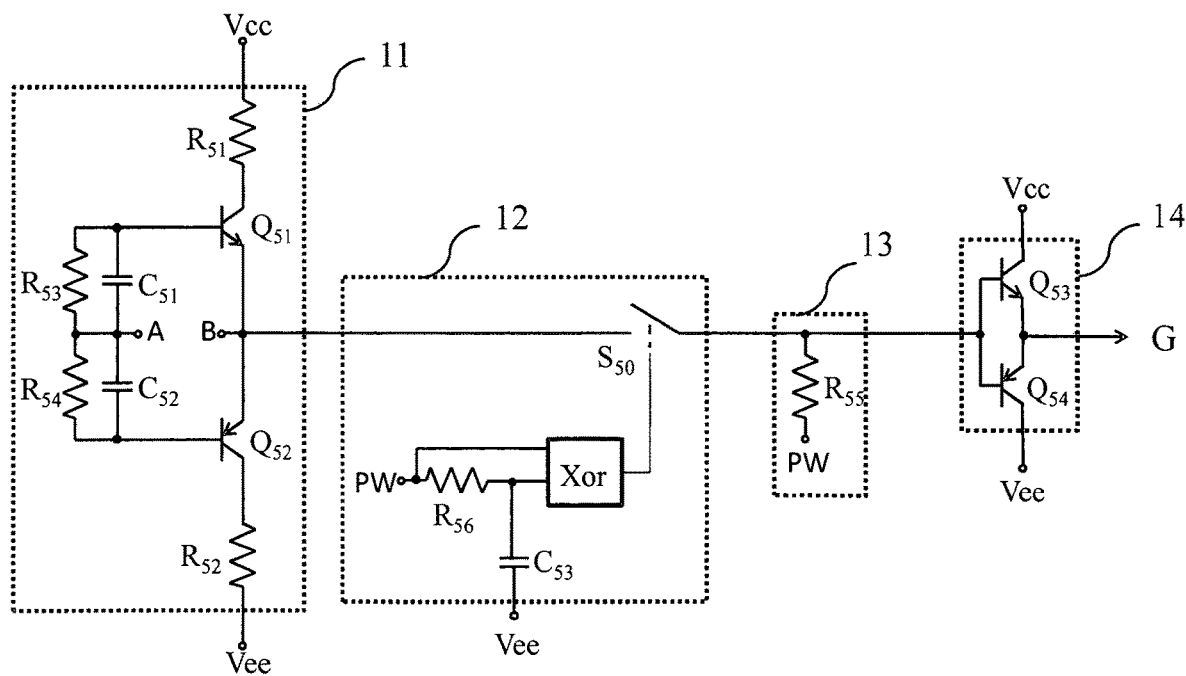
FIG. 5 represents a first example of an electronic circuit of the gate trajectory control device according to the present invention.

FIG. 5 represents a first example of an electronic circuit of the gate trajectory control device according to the present invention.

The feedback amplifier 11 is composed of two transistors $Q_{51}$ and $Q_{52}$ connected in a push-pull configuration, four resistors $R_{51}$ to $R_{54}$ and two capacitors $C_{51}$ and $C_{52}$.

A first output A of the Rogowski coil 10 is connected to first terminals of capacitors $C_{51}$ and $C_{52}$ and resistors $R_{53}$ and $R_{54}$.

A second output B of the Rogowski coil 10 is connected to emitters of transistors $Q_{51}$ and $Q_{52}$.

The transistor $Q_{51}$ is a NPN transistor and the transistor $Q_{52}$ is a PNP transistor.

The second terminals of resistor $R_{53}$ and capacitor $C_{51}$ are connected to the base of transistor $Q_{51}$.

The second terminals of resistor $R_{54}$ and capacitor $C_{52}$ are connected to the base of transistor $Q_{52}$.

The collector of transistor $Q_{51}$ is connected to a first terminal of resistor $R_{51}$, the second terminal of which is connected to a positive power supply Vcc.

The collector of transistor $Q_{52}$ is connected to a first terminal of resistor $R_{52}$, the second terminal of which is connected to a negative power supply Vee.

The emitters of transistors $Q_{51}$ and $Q_{52}$ are the output of the feedback amplifier 11.

The output of the feedback amplifier 11 is connected to the input of the blanking circuit 12.

The blanking circuit 12 is composed of a resistor $R_{56}$, a capacitor $C_{53}$, a logic Xor gate and a switch $S_{50}$.

A first terminal of the switch $S_{50}$ is connected to the input of the blanking circuit 12 and a second terminal of the switch $S_{50}$ is connected to the output of the blanking circuit 12.

The switch $S_{50}$ is controlled through the output of the Xor gate. An optional buffer stage may be added if the logic gate is not powerful enough to directly control the switch $S_{50}$.

A first input of the Xor gate is connected to the reference signal PW.

The reference signal PW is applied to a first terminal of the resistor $R_{56}$.

The second terminal of the resistor $R_{56}$ is connected to a second input of the Xor gate and to a first terminal of the capacitor $C_{53}$. A second terminal of the capacitor $C_{53}$ is connected to the negative power supply Vee.

The capacitor $C_{53}$ and the resistor $R_{56}$ form a delay that is for example equal to the sum of the gate transition delay, the voltage transition time and the current transition time plus a predetermined margin.

The output of the blanking circuit 12 is connected to the input of the summation module 13 that is composed of a resistor $R_{55}$.

A first terminal of the resistor $R_{55}$ is connected to the input of the summation module 13 and a second terminal of resistor $R_{55}$ is connected to the reference signal PW.

The output of the summation module 13 is connected to the input of the buffer 14 that is composed of two transistors $Q_{53}$ and $Q_{54}$.

The input of the buffer 14 is connected to the base of transistors $Q_{53}$ and $Q_{54}$.

The transistor $Q_{53}$ is a NPN transistor and the transistor $Q_{54}$ is a PNP transistor.

The collector of transistor $Q_{53}$ is connected to the positive power supply Vcc.

The collector of transistor $Q_{54}$ is connected to the negative power supply Vee.

The emitters of transistors $Q_{53}$ and $Q_{54}$ are the output of the buffer 14.

The output of the buffer 14 is connected to gate of power semiconductor switch S1 or S2.

Figure 6:
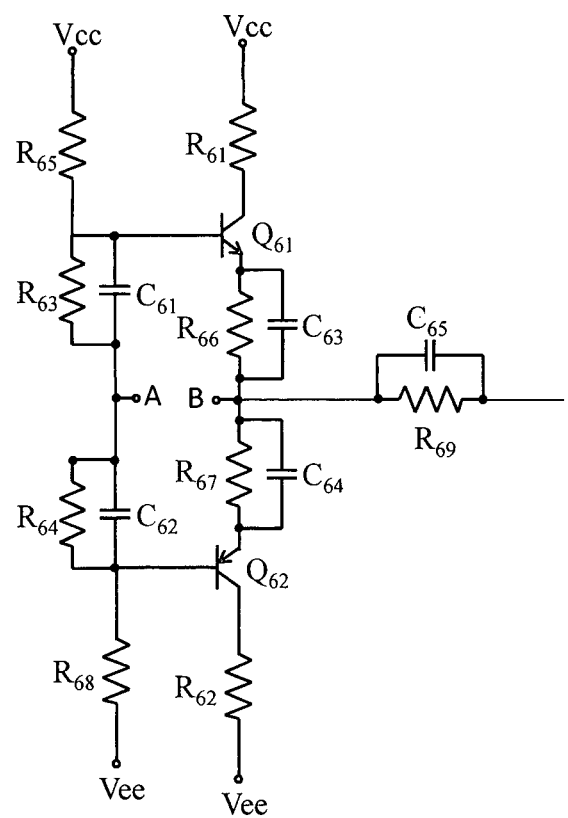
FIG. 6 represents an example of an electronic circuit of the feedback amplifier of the gate trajectory control device according to the present invention.

FIG. 6 represents an example of an electronic circuit of the feedback amplifier of the gate trajectory control device according to the present invention.

The feedback amplifier 11 is composed of two transistors $Q_{61}$ and $Q_{62}$, nine resistors $R_{61}$ to $R_{69}$ and five capacitors $C_{61}$ and $C_{65}$.

A first output A of the Rogowski coil 10 is connected to first terminals of capacitors $C_{61}$ and $C_{62}$ and resistors $R_{63}$ and $R_{64}$.

A second output B of the Rogowski coil 10 is connected to first terminals of resistors $R_{66}$, $R_{67}$ and $R_{69}$ and of capacitors $C_{63}$, $C_{64}$ and $C_{65}$.

The second terminals of transistor $R_{63}$ and capacitor $C_{61}$ are connected to a first terminal of resistor $R_{65}$ and to the base of transistor $Q_{61}$.

The transistor $Q_{61}$ is a NPN transistor and the transistor $Q_{62}$ is a PNP transistor.

A second terminal of resistor $R_{65}$ is connected to the positive power supply Vcc.

The second terminals of resistor $R_{64}$ and capacitor $C_{62}$ are connected to the base of transistor $Q_{62}$ and to a first terminal of resistor $R_{68}$.

A second terminal of resistor $R_{68}$ is connected to the negative power supply Vee.

The collector of transistor $Q_{61}$ is connected to a first terminal of resistor $R_{61}$, the second terminal of which is connected to the positive power supply Vcc.

The collector of transistor $Q_{62}$ is connected to a first terminal of resistor $R_{62}$, the second terminal of which is connected to the negative power supply Vee.

The second terminals of the resistor R69 and the capacitor C65 are the output of the feedback amplifier 11.

Figure 7A:
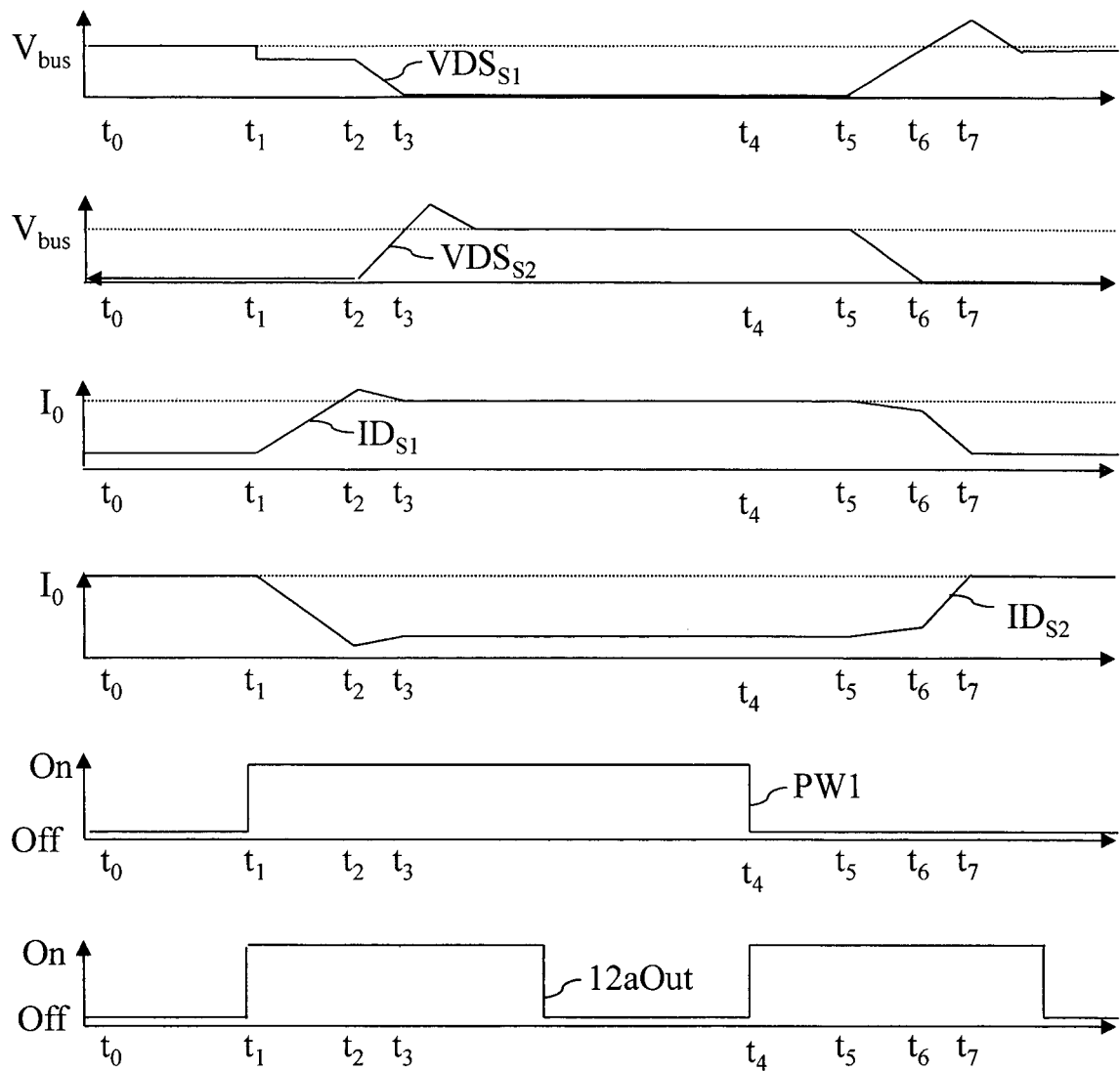
FIG. 7*a* represents a chronogram of signals provided according to the present invention.
Figure 7B:
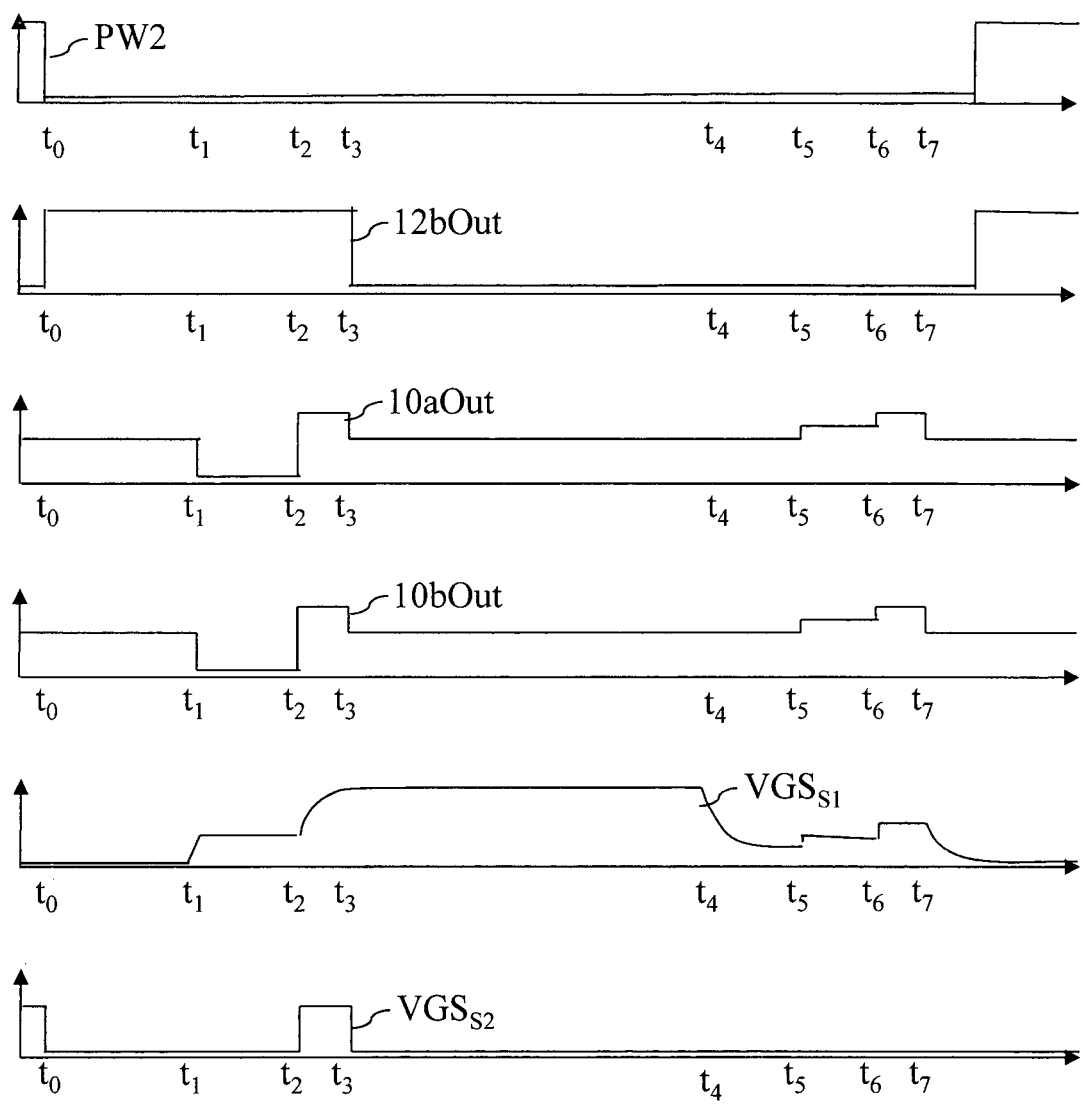
FIG. 7*b* represents a chronogram of signals provided according to the present invention.

FIGS. 7*a* and 7*b* represent chronograms of signals provided according to the present invention.

The FIGS. 7*a* and 7*b* show the evolution in the time of the drain to source voltage $VDS_{S1}$ of the power semiconductor switch S1, of the drain to source voltage $VDS_{S2}$ of the power semiconductor switch S2, of the drain to source current $ID_{S1}$ of the power semiconductor switch S1, of the drain to source current $ID_{S2}$ of the power semiconductor switch S2, of the reference signals PW1 and PW2, of the gate to source voltage $VGS_{S1}$ of the power semiconductor switch S1, of the gate to source voltage $VGS_{S2}$ of the power semiconductor switch S2, of the output 12*a*Out of the blanking circuit 12*a*, of the output 12*b*Out of the blanking circuit 12*b*, of the output 10*a*Out of the current derivative sensing means 10*a* and of the output 10*b*Out of the current derivative sensing means 10*b*.

Before time $t_0$ of FIG. 7, the reference signal PW2 is at high level and the reference signal PW1 is at low state. Before time $t_0$, the drain to source voltage $VDS_{S1}$ of the power semiconductor switch S1 is equal to the bus voltage Vbus i.e. the sum of absolute values of the positive and negative power supplies of the bus $V_{DD}$ and $V_{SS}$, the drain to source voltage $VDS_{S2}$ of the power semiconductor switch S2 is null, the drain to source current $ID_{S1}$ of the power semiconductor switch S1 is null, the drain to source current $ID_{S2}$ of the power semiconductor switch S2 is equal to $I_0$, the current supplied to the load, the gate to source voltage $VGS_{S1}$ of the power semiconductor switch S1 is at the negative rail voltage $V_{ee}$, the gate to source voltage $VGS_{S2}$ of the power semiconductor switch S2 is at high level (Vcc), the output 12*a*Out of the blanking circuit 12*a* is null, the output 12*b*Out of the blanking circuit 12*b* is null, the output 10*a*Out of the current derivative sensing means 10*a* is null and the output 10*b*Out of the current derivative sensing means 10*b* is null.

At time $t_0$, the reference signal PW2 moves from high state to low state and the output of the blanking circuit 12*b*Out moves from low state to high state.

The drain to source voltage $VDS_{S1}$ of the power semiconductor switch S1 is equal to the bus voltage Vbus, the drain to source voltage $VDS_{S2}$ of the power semiconductor switch S2 is null, the drain to source current $ID_{S1}$ of the power semiconductor switch S1 is null, the drain to source current $ID_{S2}$ of the power semiconductor switch S2 is equal to $I_0$, the gate to source voltage $VGS_{S1}$ of the power semiconductor switch S1 is null, the gate to source voltage $VGS_{S2}$ of the power semiconductor switch S2 is null, the output 12*a*Out of the blanking circuit 12*a* is null, the output 10*a*Out of the current derivative sensing means 10*a* is null and the output 10*b*Out of the current derivative sensing means 10*b* is null.

At time $t_1$, the reference signal PW1 and the signal 12*a*Out at the output of the blanking circuit 12*a* move to high state.

The drain to source voltage $VDS_{S1}$ of the power semiconductor switch S1 is equal to the bus voltage minus the voltage drop in parasitic inductances, the drain to source voltage $VDS_{S2}$ of the power semiconductor switch S2 is null, the drain to source current $ID_{S1}$ of the power semiconductor switch S1 starts to increase, the drain to source current $ID_{S2}$ of the power semiconductor switch S2 starts to decrease, the gate to source voltage $VGS_{S1}$ of the power semiconductor switch S1 increases up to the Miller Plateau voltage if the power semiconductor switch has a gate or increases up to a voltage ensuring the target current derivative in the di/dt in the power semiconductor switch, the gate to source voltage $VGS_{S2}$ of the power semiconductor switch S2 is null, the output 12*a*Out of the blanking circuit 12*a* is high as the output of the blanking circuit 12*b*, the output 10*a*Out of the current derivative sensing means 10*a* is negative and the output 10*b*Out of the current derivative sensing means 10*b* is negative.

At time $t_2$, the reference signal PW1 and the signal 12*a*Out at the output of the blanking circuit 12*a* are at high state.

The drain to source voltage $VDS_{S1}$ of the power semiconductor switch S1 is equal to the bus voltage minus the voltage drop in parasitic inductances, the drain to source voltage $VDS_{S2}$ of the power semiconductor switch S2 is null, the drain to source current $ID_{S1}$ of the power semiconductor switch S1 stops to increase, the drain to source current $ID_{S2}$ of the power semiconductor switch S2 stops to decrease, the gate to source voltage $VGS_{S1}$ of the power semiconductor switch S1 is rising toward the positive power supply voltage $V_{cc}$, the gate to source voltage $VGS_{S2}$ of the power semiconductor switch S2 is null, the output 12*a*Out of the blanking circuit 12*a* is high as the output of the blanking circuit 12*b*, the output 10*a*Out of the current derivative sensing means 10*a* is positive and the output 10*b*Out of the current derivative sensing means 10*b* is positive.

At time $t_2$, the current going through the power semiconductor switch S1 has reached the output current plus the recovery current of the anti-parallel diode of the power semiconductor switch S2. The current is falling back to the output current leading to a positive feedback voltage added to the already positive reference signal. Thus, the gate voltage of the power semiconductor switch S1 is pulled up to the positive power supply voltage. On the power semiconductor switch S2, the feedback voltage is also positive; this voltage is added to the pulled down reference signal PW2 leading to a positive voltage on the power semiconductor switch S2 gate. Both power semiconductor switches S1 and S2 are in a linear state. In this case, the power semiconductor switch can be modelled as a variable resistor damping the oscillating circuit made by the parasitic inductance and capacitance. The anti-parallel diode of the power semiconductor switch S2 is blocked at time $t_2$ enabling the voltage fall on the power semiconductor switch S1 and conversely the rise on the power semiconductor switch S1.

At time $t_3$, the voltage across the power semiconductor switch S2 has reached the bus voltage $V_{bus}$. Consequently the voltage across the power semiconductor switch S1 is null. No current is flowing in the power semiconductor switch S2 and all the load current $I_0$ is flowing in the power semiconductor switch S1. The gate to source voltage $VGS_{S1}$ of the power semiconductor switch S1 has reached the positive supplied voltage $V_{cc}$. The gate to source voltage $VGS_{S2}$ of the power semiconductor switch S2 is pulled down to the negative supply voltage $V_{ee}$ by the signal PW2. The output 10*b*Out of the current derivative sensing means 10*b* is null. As a result, no feedback is added to PW2. On the power semiconductor switch S2, there is an overshoot voltage that is directly related to the current slope in the power semiconductor switch just before time $t_3$. The value of this current slope is proportional to the current slope controlled by the power semiconductor switch S1 during the interval between $t_1$ and $t_2$.

The turn-off phase starts at time $t_4$. At this time, the reference signal PW1 moves from high state to low state and the output of the blanking circuit 12aOut moves from low state to high state. The gate of the power semiconductor switch S1 is pulled down to the negative power supply $V_{ee}$. The gate to source of the power semiconductor switch S1 is falling towards the negative power supply $V_{ee}$. All the other signals remain identical until the gate to source voltage of the power semiconductor switch S1 has reached the Miller plateau voltage.

At time $t_5$, the voltage rises across the power semiconductor switch S1 without any feedback compensation. The opposite voltage transition occurs on the power semiconductor switch S2. This voltage variation induces a current in the power semiconductor switch capacitance:

$$IC_{S_x} = C_{S_x} \frac{dV_{DS}(t)}{dt}$$

Then, at time $t_6$, the current starts falling and a feedback compensation is added to the reference signal PW1 of power semiconductor switch S1 slowing down the current transition. In the mean time, the blanking circuit is preventing the feedback on the power semiconductor switch S2 to turn on the power semiconductor switch S2 leading to a leg short-circuit. Since PW2 signal provided to the power semiconductor switch S2 is at low level, the output 12aOut of the blanking circuit 12a stays low during all the turn-off phase. The gate to source voltage $VGS_{S2}$ of the power semiconductor switch S2 is pulled down to the negative supply voltage.

At time $t_6$, the voltage across the power semiconductor switch S2 is null and the voltage across the power semiconductor switch S1 is equal to the bus voltage $V_{bus}$. At this time, the current can start to fall in the power semiconductor switch S2 and consequently rises in the power semiconductor switch S1. This step current slope induces a positive voltage at the output 10bOut of the current derivative sensing means 10. This voltage is added to the negative voltage of the reference signal PW2. Therefore the gate to source voltage $VGS_{S1}$ of the power semiconductor switch S1 increases up to a voltage ensuring the target di/dt in the power semiconductor switch S1. During this time interval, the current slope in the switch is regulated by the feedback loop.

Between intervals $t_6$ and $t_7$, there is an overvoltage on the power semiconductor switch S1. This overvoltage is determined by the current slope in the power semiconductor switch during the aforementioned interval.

At $t_7$, the current in the power semiconductor switch S1 is mill and the current in the power semiconductor switch S2 has reached the load current $I_0$. The output 10bOut of the current derivative sensing means 10 is null. The gate to source voltage $VGS_{S1}$ of the power semiconductor switch S1 is pulled down to the negative power supply $V_{SS}$ of the bus.

Figure 8:
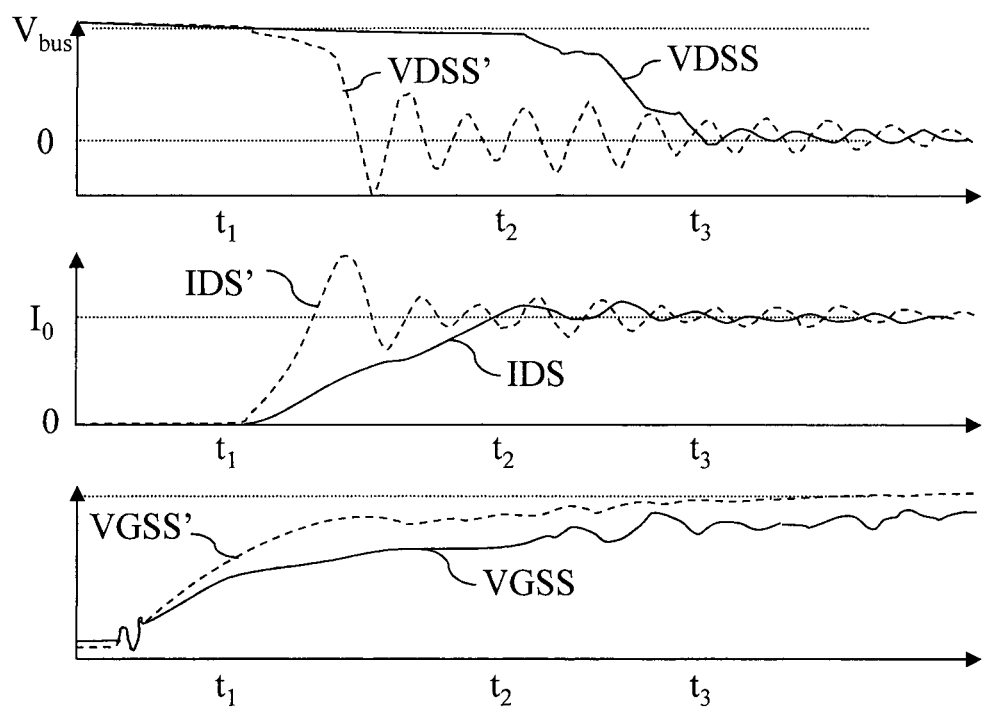
FIG. 8 represents a detailed chronogram of current and voltages on a power semiconductor switch during switching OFF when the present invention is or is not implemented.

FIG. 8 represents a detailed chronogram of current and voltages on a power semiconductor switch during switching OFF when the present invention is or is not implemented.

The curve noted VDSS' shows the drain to source voltage of a power semiconductor switch during switching OFF when the present invention is not implemented and the curve noted VDSS shows the drain to source voltage of a power semiconductor switch during switching OFF when the present invention is implemented.

The curve noted IDS' shows the drain to source current of a power semiconductor switch during switching OFF when the present invention is not implemented and the curve noted IDS shows the drain to source current of a power semiconductor switch during switching OFF when the present invention is implemented.

The curve noted VGSS' shows the gate to source voltage of a power semiconductor switch during switching OFF when the present invention is not implemented and the curve noted VGSS shows the gate to source voltage of a power semiconductor switch during switching OFF when the present invention is implemented.

As it can be seen in FIG. 8, the present invention reduces the current transient rate and/or the voltage overshoot.

Figure 9:
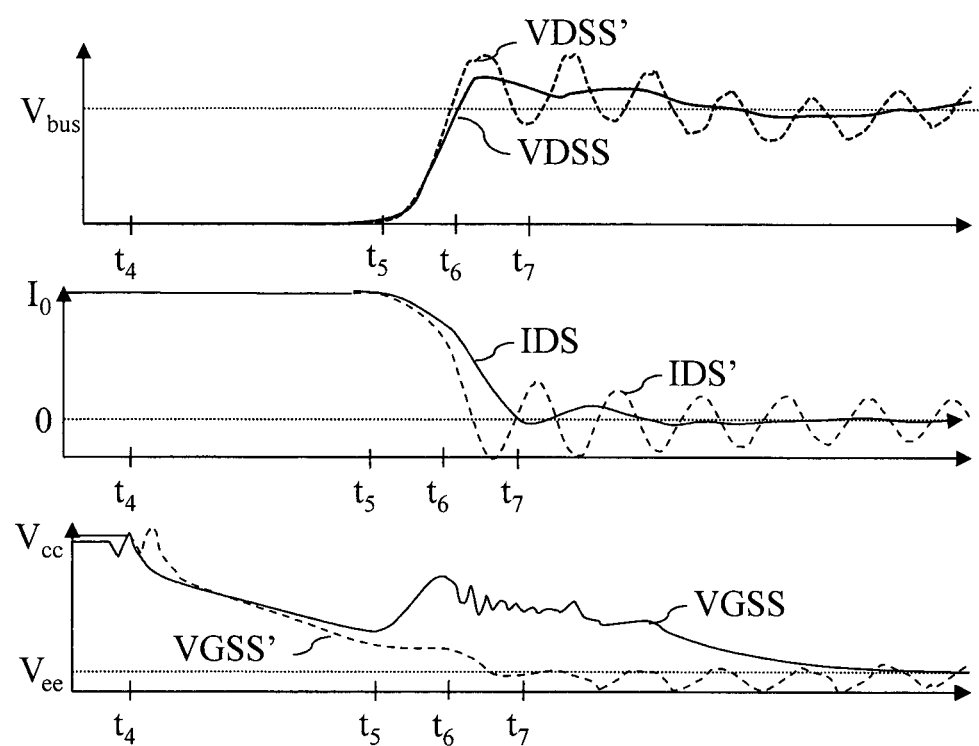
FIG. 9 represents a detailed chronogram of current and voltages on a power semiconductor switch during switching ON when the present invention is or is not implemented.

FIG. 9 represents a detailed chronogram of current and voltages on a power semiconductor switch during switching ON when the present invention is or is not implemented.

The curve noted VDSS' shows the drain to source voltage of a power semiconductor switch during switching ON when the present invention is not implemented and the curve noted VDSS shows the drain to source voltage of a power semiconductor switch during switching ON when the present invention is implemented.

The curve noted IDS' shows the drain to source current of a power semiconductor switch during switching ON when the present invention is not implemented and the curve noted IDS shows the drain to source current of a power semiconductor switch during switching ON when the present invention is implemented.

The curve noted VGSS' shows the gate to source voltage of a power semiconductor switch during switching ON when the present invention is not implemented and the curve noted VGSS shows the drain to source voltage of a power semiconductor switch during switching ON when the present invention is implemented.

As it can be seen in FIG. 9, the present invention reduces the current transient rate and/or the voltage overshoot.

Figure 10:
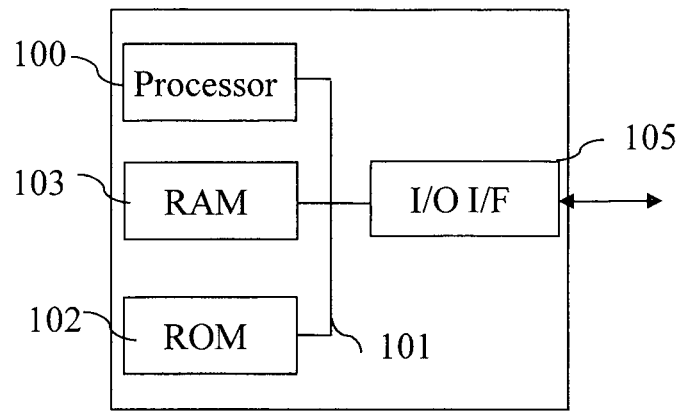
FIG. 10 represents a second example of an architecture of a gate trajectory control device according to the present invention.

FIG. 10 represents a second example of an architecture of a gate trajectory control device according to the present invention.

Figure 11:
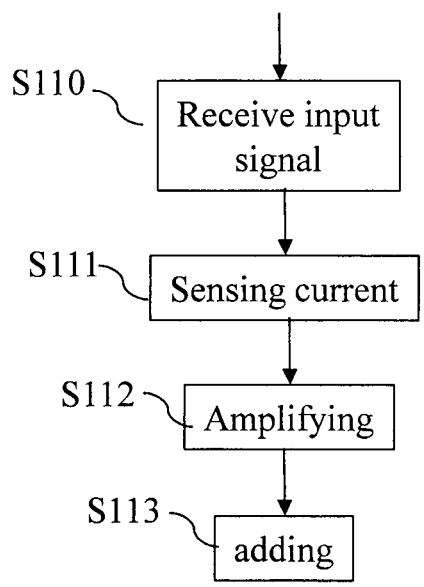
FIG. 11 represents an algorithm executed by the gate trajectory control device according to the second example of gate trajectory control device.

The gate trajectory control device has, for example, an architecture based on components connected together by a bus 101 and a processor 100 controlled by a program as disclosed in FIG. 11.

The bus 101 links the processor 100 to a read only memory ROM 102, a random access memory RAM 103 and an input output I/O IF interface 105.

The memory 103 contains registers intended to receive variables and the instructions of the program related to the algorithm as disclosed in FIG. 11.

The processor 100 receives through the input output I/O IF 105 measurement of the derivative of the drain to source current, the input signal PW1 or PW2.

The read-only memory, or possibly a Flash memory 102 contains instructions of the program related to the algorithm as disclosed in FIG. 11, when the reference module 102 is powered on, to the random access memory 103.

The gate trajectory control device may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the gate trajectory control device includes circuitry, or a device including circuitry, causing the gate trajectory control device to perform the program related to the algorithm as disclosed in FIG. 11.

FIG. 11 represents an algorithm executed by the gate trajectory control device according to the second example of gate trajectory control device.

At step S110, the gate trajectory control device receives an input signal that is intended to drive the semiconductor power switch, characterized in that the device comprises:

At step S111, the gate trajectory control device senses the drain to source current going through the semiconductor power switch in order to obtain a voltage representative of the sensed drain to source current, At step S112, the gate trajectory control device amplifies the voltage representative of the sensed drain to source current, At step S113, the gate trajectory control device adds the amplified voltage representative of the sensed drain to source current to the input signal during a given time period.

Naturally, many modifications can be made to the embodiments of the invention described above without departing from the scope of the present invention.

The invention claimed is:

1. Device for controlling the switching from a conducting state to a non conducting state or from a non conducting state to a conducting state of a semiconductor power switch providing current to a load, the device receiving an input signal that is intended to drive the semiconductor power switch, characterized in that the device comprises:
    a sensor for sensing the derivative of the drain to source current going through the semiconductor power switch in order to obtain a voltage representative of the sensed derivative of drain to source current,
    an amplifier for amplifying the voltage representative of the sensed derivative of drain to source current,
    an adder for adding the amplified voltage representative of the derivative of the sensed drain to source current to the input signal during a given time period that is equal to the sum of a gate transition time, a voltage transition time and a current transition time plus a predetermined margin and the adding is performed using an exclusive OR logic operation of the input signal and the input signal delayed by the given time period.

2. The device according to claim 1, wherein the sensor for sensing the derivative of the drain to source current going through the semiconductor power switch are composed of a Rogowski coil.

3. The device according to claim 2, wherein the semiconductor power switch is included in a buck converter.

4. The device according to claim 2, wherein the semiconductor power switch is included in a boost converter.

5. The device according to claim 2, wherein the semiconductor power switch is included in a half bridge configuration that comprises a first and a second semiconductor power switches and the switching of each semiconductor power switch being controlled by a respective device for controlling the switching from a conducting state to a non conducting state or from a non conducting state to a conducting state.

6. The device according to claim 1, wherein the semiconductor power switch is included in a buck converter.

7. The device according to claim 1, wherein the semiconductor power switch is included in a boost converter.

8. The device according to claim 1, wherein the semiconductor power switch is included in a half bridge configuration that comprises a first and a second semiconductor power switches and the switching of each semiconductor power switch being controlled by a respective device for controlling the switching from a conducting state to a non conducting state or from a non conducting state to a conducting state.

9. A method for controlling the switching from a conducting state to a non conducting state or from a non conducting state to a conducting state of a semiconductor power switch providing current to a load, characterized in that the method comprises the steps of:
    receiving an input signal that is intended to drive the semiconductor power switch, characterized in that the device comprises:
    sensing the derivative of the drain to source current going through the semiconductor power switch in order to obtain a voltage representative of the sensed derivative of drain to source current,
    amplifying the voltage representative of the sensed derivative of the drain to source current,
    adding the amplified voltage representative of the sensed derivative of the drain to source current to the input signal during a given time period that is equal to the sum of a gate transition time, a voltage transition time and a current transition time plus a predetermined margin and the adding is performed using an exclusive OR logic operation of the input signal and the input signal delayed by the given time period.

10. The method according to claim 9, wherein the sensing derivative of the drain to source current going through the semiconductor power switch is performed using a Rogowski coil.

* * * * *